United States Patent [19]
Omika et al.

[11] Patent Number: 5,665,496
[45] Date of Patent: Sep. 9, 1997

[54] METHOD FOR PRODUCING COLOR FILTER

[75] Inventors: Hiroyoshi Omika; Yutaka Otsuki; Hitoshi Yuasa; Eiji Yoda; Toru Nakamura, all of Yokohama; Masayuki Ando, Kashiwa; Teruhisa Kuroki, Kawasaki; Norikatsu Ono, Narashino, all of Japan

[73] Assignees: Nippon Oil Co., Ltd., Minato-ku; Dai Nippon Printing Co., Ltd., Shinjuki-ku, both of Japan

[21] Appl. No.: 489,817

[22] Filed: Jun. 13, 1995

[30] Foreign Application Priority Data

| Jun. 24, 1994 | [JP] | Japan | 6-143156 |
| Jun. 24, 1994 | [JP] | Japan | 6-143157 |
| Jul. 28, 1994 | [JP] | Japan | 6-177032 |

[51] Int. Cl.$^6$ ............................................. G03F 9/00
[52] U.S. Cl. ..................... 430/7; 430/293; 430/321; 430/322; 430/328
[58] Field of Search .................. 430/7, 293, 321, 430/20, 328, 322; 205/121, 134, 135, 129

[56] References Cited

U.S. PATENT DOCUMENTS

| 5,214,541 | 5/1993 | Yamasita et al. | 359/891 |
| 5,214,542 | 5/1993 | Yamasita et al. | 359/891 |
| 5,314,770 | 5/1994 | Yamasita et al. | 430/7 |
| 5,334,468 | 8/1994 | Yamasita et al. | 430/7 |
| 5,368,977 | 11/1994 | Yoda et al. | 430/190 |
| 5,372,902 | 12/1994 | Yamashita et al. | 430/7 |
| 5,385,795 | 1/1995 | Yuasa et al. | 430/7 |
| 5,399,449 | 3/1995 | Tanimoto et al. | 430/7 |
| 5,411,836 | 5/1995 | Yoda et al. | 430/190 |
| 5,422,207 | 6/1995 | Yoda et al. | 430/7 |
| 5,427,888 | 6/1995 | Yoda et al. | 430/192 |

*Primary Examiner*—Thorl Chea
*Attorney, Agent, or Firm*—Darby & Darby

[57] ABSTRACT

A method for producing a color filter involves (a) forming a positive photosensitive coating film on a transparent electrically conductive layer of a transparent substrate; (b) forming a light-irradiated region where a light irradiation amount is different in two steps; (c) developing a larger light-irradiated portion to lay-open the transparent electrically conductive layer followed by electrodepositing a light shielding layer thereon; (d) forming on the positive photosensitive coating film undeveloped in the step (c) a light-irradiated region where a light irradiation amount is different in two steps; (e) developing a larger light-irradiated portion of the photosensitive coating film to lay-open the transparent electrically conductive layer followed by electrodepositing a colored coating thereon; (f) forming on the positive photosensitive coating film undeveloped in the step (e) a light-irradiated region where a light irradiation amount is different in at least three steps; and (g) developing the photosensitive coating film to lay-open the transparent electrically conductive layer followed by electrodepositing a colored coating thereon, operation of the developing and electrodepositing being sequentially repeated at least twice in decreasing light irradiation amounts.

13 Claims, 3 Drawing Sheets

☐ 100% LIGHT TRANSMITTANCE PORTION
◩ 70% LIGHT TRANSMITTANCE PORTION
▨ 0% LIGHT TRANSMITTANCE PORTION

☐ 100% LIGHT TRANSMITTANCE PORTION
▨ 0% LIGHT TRANSMITTANCE PORTION

☐ 100% LIGHT TRANSMITTANCE PORTION
◨ 70% LIGHT TRANSMITTANCE PORTION
▨ 0% LIGHT TRANSMITTANCE PORTION

METHOD FOR PRODUCING COLOR FILTER

BACKGROUND OF THE INVENTION

This invention relates to a method for producing a color filter and more particularly to a method for producing a color filter convenient to be employed as a color liquid crystal display device.

Up to now, color filters in general have been produced by a dyeing method, a printing method or a pigment dispersion method, in which a transparent substrate is dyed using a binder containing a dye or a pigment.

However, since the dyeing method is a method for selectively dyeing a thin resin film on a substrate with a dyestuff, it is necessary to carry out the resist printing process and the photolithographic process each time the color is changed, such that the process becomes complex with consequential rise in production costs. On the other hand, since the dyestuff is employed as a coloring agent, the product is poor in thermal resistance, weatherability or resistance against chemicals. Although there is no necessity of carrying out the resist printing process with the above printing method, there is a limitation imposed on refinement of color patterns, such that, the more variegated the color pattern, the precision of the printing position becomes the worse. Although it is possible to generate fine patterns with the pigment dispersion method, the photolithographic process of high precision needs to be carried out each time the color is changed, thus complicating the process.

On the other hand, there has been proposed a method for producing a color filter by an electrodeposition coating method. For example, with the electrodeposition method for preparation of the color filter, in which a transparent electrode is previously formed with a pre-set pattern and placed in a vat containing an ionized high molecular material containing a dye or a pigment dissolved or dispersed in a solvent, and in which a color filter is produced under application of an electrical voltage, a transparent electrode for the formation of the color filter is required in addition to the transparent display electrode. Since the transparent electrode needs to be insulated from one color to another, an etching process is required, while there is a risk of the decreased yield due to line defects produced by electrical shorting. Besides, since respective pixels need to be electrically coupled to one another, there is imposed a limitation on pixel arraying.

In the Japanese Laid-Open Patent Application No.61-203403, there is disclosed a method for producing a color filter by peeling a photosensitive coating film on an electrode in a pattern by a photolithographic process, effecting electrodeposition coating on an exposed portion of the electrode surface, and peeling the photosensitive coating film of a neighboring region followed by electrodeposition. In the Japanese Laid-Open Patent Application No.61-272720, there is disclosed a method for producing a color filter by forming a positive photosensitive coating film on an electrically conductive layer, exposing and developing the coating and electrodepositing the developed coating on the exposed portion. In the Japanese Laid-Open Patent Application No.61-279803, there is disclosed a method for producing a color filter by exposing and developing a positive photosensitive resin layer on a transparent electrode in a mosaic pattern for effecting the electrodeposition followed by forming another neighboring mosaic pattern and effecting electrodeposition. The production process is complicated with these methods since the colored layers need to be formed by a process of light irradiation and development from one color to another.

There has recently been proposed in Japanese Laid-Open Patent Application No.4-287003 a method consisting in forming patterns different in at least three stages on a photosensitive coating film formed on a transparent electrically conductive layer by one step of light irradiation and sequentially repeating the steps of development and formation of colored layers. This method has an advantage that, since the pattern can be formed by one light irradiation step, the process may be simplified and the number of expensive light irradiation units may be decreased while there is no necessity of precise registration for pattern formation as compared to the photolithographic process in which the colored layers are formed separately from color to color. Although the method of forming the entire pattern required of the color filter by one light irradiation operation is excellent as the method per se, there may be occasions in which the conditions of light exposure and development become more severe than with the conventional method of repeating the light irradiation and development from color to color. In such case, the photosensitive coating film tends to be lowered in durability while there is a risk of deterioration in pattern precision.

For resolving such deficiency, there is proposed a method consisting in forming a light shielding layer in need of utmost precision using a first photosensitive coating film and forming patterns for other colored layers by sole light irradiation as described above. There is also proposed a method consisting of carrying out the light exposure for pattern formation by two steps and re-forming the second photosensitive coating film in need of durability to meet with light irradiation. These methods are meritorious in that the production process is simplified as compared to the photolithographic process in which the colored layers are formed from color to color. However, since at least two photosensitive coating films need to be formed, material costs are increased as compared to the method of using a sole photosensitive coating film. With the method for producing a color filter in which the photosensitive resin constituting the photosensitive coating film accounts for a major portion of material costs and is coated by electrodeposition coating which substantially inhibits reutilization of the coating material, the problem of material costs is crucial in industrial production and in need of improvement along with process simplification.

SUMMARY OF THE INVENTION

In view of the foregoing, it is an object of the present invention to resolve the above problems and to provide a method for producing a color filter which assures a larger degree of freedom of the shape of the light shielding layer and the colored layers and which lends itself to a larger format and to facilitated and simplified mass production of the color filter at low costs.

It is another object of the present invention to provide a method for producing a color filter having at least red, green and blue colored layers and a dark-colored light shielding layer and occasionally having a transparent outer frame portion, as a liquid crystal color display color filter, by a simplified process at low costs.

It is still another object of the present invention to provide a method for producing a color filter by electrodeposition which color filter has superior quality free from irregular color, pinholes or whiting (the thickness of the pixels becomes thin) despite the fact that the filter has a fine and intricate pixel array.

The above and other objects of the invention will become apparent from the following description.

The present inventors have conducted investigations into a method for producing a color filter which can assure a larger degree of shape freedom of the light shielding layer and the colored layers and which can lend itself to a larger filter format, and found that a color filter can be produced at low cost with high precision by a simplified process of combining the positive photoresist and a particular light exposure method.

According to the present invention, there is provided a method for producing a color filter comprising the steps of (a) forming a positive photosensitive coating film on a transparent electrically conductive layer of a transparent substrate having the transparent electrically conductive layer thereon; (b) forming on the positive photosensitive coating film a light-irradiated region where a light irradiation amount is different in two steps; (c) developing a larger light-irradiated portion of the positive photosensitive coating film to lay-open the transparent electrically conductive layer followed by electrodepositing a light shielding layer thereon; (d) forming on the positive photosensitive coating film undeveloped in the step (c) a light-irradiated region where a light irradiation amount is different in two steps; (e) developing a larger light-irradiated portion of the photosensitive coating film in the light irradiated region formed in the step (d) to lay-open the transparent electrically conductive layer followed by electrodepositing a colored coating thereon to from a colored layer; (f) forming on the positive photosensitive coating film undeveloped in the step (e) a light-irradiated region where a light irradiation amount is different in at least three steps; and (g) developing the photosensitive coating film in the light-irradiated region formed in the step (f) to lay-open the transparent electrically conductive layer followed by electrodepositing a colored coating thereon to form a colored layer. The operation of the developing and electrodepositing is sequentially repeated at least twice in an order of decreasing light irradiation amounts to thereby form at least a colored layer.

PREFERRED EMBODIMENTS OF THE INVENTION

Figure 1:
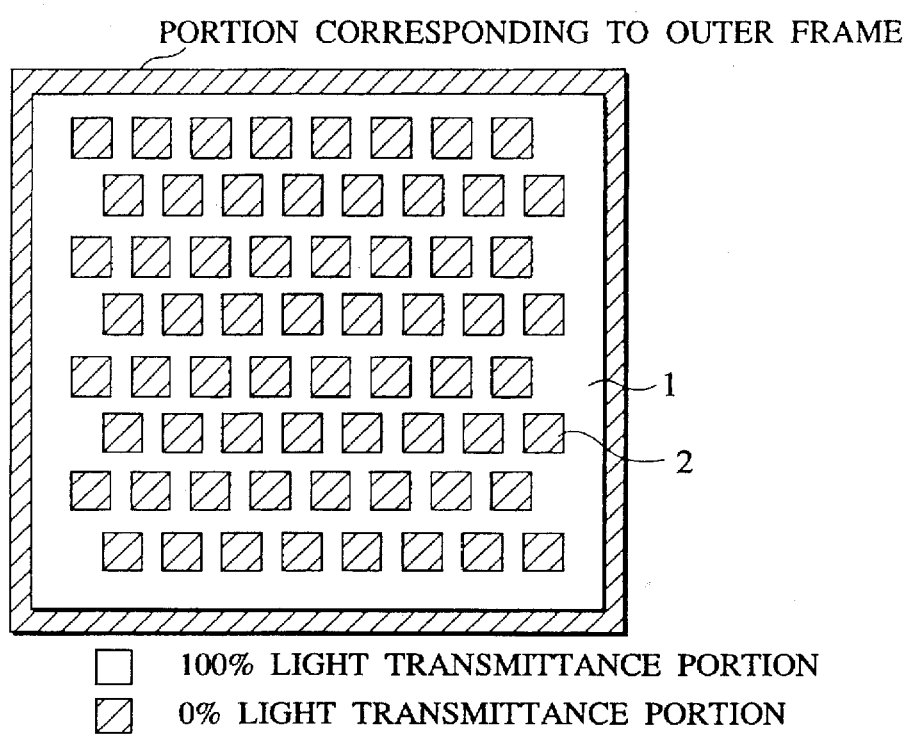
FIG. 1 is a schematic plan view showing a mask having light transmittances different in two steps.

The present invention will be explained in detail hereinbelow.

In the method of the present invention, a positive photosensitive coating film is formed on a transparent electrically conductive layer of a transparent substrate having the transparent electrically conductive layer thereon (Hereinafter referred to as "step (a)".).

There is no particular limitation to the transparent substrate employed in the present invention, provided that it is a plate-shaped transparent substrate. The substrate material may be enumerated by glass, various laminated plates, various plastic plates and other plate-shaped insulators. Of these, glass is most preferred. In view of the performance of the color filter, the substrate surface is preferably smooth and, if necessary, may be polished. Although the thickness of the transparent substrate may be suitably selected according to usage and application, it is preferably on the order of 0.1 to 2 mm.

The material of the transparent electrically conductive layer formed on the substrate includes a material composed of tin oxide, indium oxide, antimony oxide or indium-tin oxide. Indium-tin oxide is particularly preferred. The film thickness of the transparent electrically conductive layer is preferably 20 to 300 nm. There is no limitation to the method for forming the transparent electrically conductive layer and any of known methods such as spraying method, chemical vapor deposition, sputtering or vacuum deposition may be employed. In view of the performance of the color filter, the transparent electrically conductive layer as transparent as possible is preferably employed.

Although there is no limitation to the method for forming the positive photosensitive coating film formed on the transparent electrically conductive layer of the transparent substrate, the positive photosensitive coating film may be applied to the transparent electrically conductive layer by any known methods, such as electrodeposition, spraying, dip coating, roll coating, screen printing or spin coating. Spin coating is particularly preferred. If the spin coating is carried out, the coating film is preferably dried. Although there is no limitation to the drying conditions, the drying temperature and the drying time are usually 50° to 150° C. and 1 to 30 minutes, respectively.

A positive photosensitive coating resin for forming the positive photosensitive coating film may be enumerated by a resin having the film forming capability and photosensitivity. There is no limitation to the positive photosensitive coating resin preferably employed in the present invention, provided that the light-irradiated portion can be eluted with a developing solution. Examples of the positive photosensitive coating resin include a resin having a quinone diazide group, a resin having diazomeldrum's acid or nitrobenzyl ester and a resin composition containing these resins. Specifically, the positive photosensitive coating resin may be enumerated by a cationic resin which may be solubilized in acids or acidic substances, such as formic acid, acetic acid, propionic acid or lactic acid, and which is a produced by introducing an amino group, ammonium or an onium group such as sulfonium and a hydroxyl group into acrylic resin, epoxy resin, urethane resin or polybutadiene resin and adding a quinone diazide sulfonic acid compound by an esterification reaction; an anionic resin which may be solubilized and/or dispersed in water with a basic substance, such as triethylamine, diethylamine, dimethyl ethanolamine or ammonia and which is produced by introducing a carboxylic group and a hydroxyl group into acrylic resin, polyester resin, maleinated oil resin, polybutadiene resin or epoxy resin and adding a quinone diazide sulfonic acid compound by an esterification reaction; and a resin composition produced by suitably mixing a film-forming resin such as novolak cresol resin and a resin obtained by reacting a compound containing a hydroxyl group such as polyhydroxybenzophenone and a quinone diazide sulfonic acid derivative. For simplifying the process and combatting the pollution, it is desirable to use a resin capable of being solubilized and/or dispersed in water. The mixing ratio in the above composition may be optionally selected depending on the light irradiating conditions or developing conditions. In addition, a positive photosensitive resin containing compounds containing groups capable of generating an alkali or a water-soluble group by an acid catalyst and a compound which generates an acid by light (photo-acid generator) as essential components may also be employed.

When forming a positive photosensitive coating film on a transparent substrate having a transparent electrically conductive layer, the positive photosensitive resin may be directly employed as such or dissolved in an organic solvent and/or water so as to be used as a positive photosensitive coating or paint. Examples of these organic solvents include various glycol ethers, such as ethylene glycol monobutyl ether, ethylene glycol monohexyl ether, ethylene glycol monophenyl ether, propylene glycol monomethyl ether, propylene glycol monophenyl ether, diethylene glycol dimethyl ether or triethylene glycol dimethyl ether; ketones, such as acetone, methylethylketone, methylisobutylketone, cyclohexanone, isophorone or N-methyl pyrrolidone; ethers such as dibutyl ether, dioxane or tetrahydrofuran; alcohols, such as methoxy butanol, diacetone alcohol, butanol, octanol or isopropanol; hydrocarbons, such as toluene, xylene, cyclohexane or hexane; esters, such as ethyl acetate, butyl acetate, 2-methoxyethyl acetate, 2-ethoxyethyl acetate, 2-methoxypropyl acetate, or ethyl benzoate; and acid amides, such as dimethyl formamide, N,N-dimethyl acetamide or dimethyl sulfoxide. These may be used singly or in combination.

For facilitating solubilization or dispersion, improving bath stability and producing a smooth coating film, the organic solvents may be added at the time of solubilizing and/or dispersing the cationic or anionic resin in water.

If necessary, the positive photosensitive coating may be admixed with dyes and/or pigments. The color hues of the dyes and/or the pigments may be suitably selected according to usage and application. For improving resolution of the positive photosensitive coating, for example, it is desirable to admix a dye capable of absorbing light having a wavelength of 400 to 500 nm, such as oil yellow, or UV absorbing agents, such as trihydroxy benzophenone, with a view to eliminating the light of a longer wavelength exhibiting acute diffraction on light irradiation. Depending on the desired color hues, two or more of different types of the dyes and/or the pigments may be used in mixture insofar as the properties of the dyes and/or the pigments are not impaired. The proportions of the dyes and/or pigments are suitably selected depending on the usage or applications color hues, types of the dyes and/or pigments employed or the dry thickness of the positive photosensitive coating, and are preferably not more than 10 wt % and, above all, not more than 5.0 wt % based on the total positive sensitive coating.

The positive photosensitive coating may be prepared by mixing the positive photosensitive coating resin, organic solvents and/or water, dyes and/or pigments, if necessary, acidic or basic substances, dispersion assistant agents for the dyes and/or the pigments, or a variety of assistant agents, such as levelling agents for improving smoothness of the coating films, viscosity adjustment agents or anti-foaming agents, sufficiently dispersing the resulting mixture using dispersion devices, such as sand mills, roll mills or attriters and diluting the resulting product to a desired concentration. There is no particular limitation to the film thickness of the positive photosensitive coating film formed by the positive photosensitive coating prepared in this manner. The film thickness can be suitably selected depending on the performance required of the color filter. The dry film thickness of the positive photosensitive coating film is usually 0.3 to 20 μm, preferably 0.5 to 15 μm and more preferably 1 to 3 μm.

If the film is formed by electrodeposition, the film thickness can be controlled by adjusting electrodeposition conditions, such as current, voltage, electrodeposition time or liquid temperature. However, the electrodeposition may usually be carried out under conditions similar to those used for electrodeposition of the colored coating, as will be explained subsequently.

In the method of the present invention, a light-irradiated region where a light irradiation amount is different in two steps is formed on the positive photosensitive coating film (Hereinafter referred to as "step (b)".). One of the portions in which the light irradiated amount is different in two steps may be a non-irradiated portion.

There is no particular limitation to the shape of the light-irradiated region. For example, it is preferred, to subject only necessary portions to light irradiation via a mask to thereby form light-irradiated and non light-irradiated portions or to irradiate the photosensitive coating film once using a mask having different light transmittances in two steps to thereby form a light-irradiated region where light-irradiated amounts are different in two steps. It is in general more preferred to increase the relative difference in respective light transmittances since the light irradiation amount and the light irradiation time then can be adjusted more easily. However, if the difference in light transmittance is small, the same objective may be achieved by increasing the light irradiation amount or prolonging the light irradiation time. That is, while no limitations are imposed on the relative difference in light transmittances, it is desirable that the significant relative difference be usually not less than preferably not less than 50% and preferably 100%. In case of significant relative difference of 100%, light-irradiated and non light-irradiated portions are formed. Such large significant difference is most preferred since the large relative difference in light transmittances results in lowered damages to the photosensitive coating film including damages in the next development step. The light transmittance means the ratio of light intensity before and after transmission of irradiating light through the mask.

In the method of the present invention, a larger light-irradiated portion of the positive photosensitive coating film is developed to lay-open the transparent electrically conductive layer, and a light shielding layer is then electrodeposited thereon (Hereinafter referred to as "step (c)".).

The development of the photosensitive coating film in the light-irradiated region with a larger light irradiation amount may be carried out under a selected one of developing conditions which will be enumerated subsequently.

The light shielding layer is formed in the step (c) after development on the exposed transparent electrically conductive layer by electrodeposition coating. The light shielding layer is first formed because the light shielding layer is in need of utmost precision in a color filter. In addition, if the light shielding layer is formed during the first step in which there is no necessity for registration with other patterns, pattern registration during the steps of forming the other colored layers may be facilitated. The electrodeposition coating is a coating method of precipitating colored coatings on only the portions of the transparent electrically conductive layers laid-open by the development step and may be carried out under electrodepositing conditions which will be explained subsequently.

Although the color hue of the light shielding layer may be suitably selected according to the usage and application, black or dark color hue is usually desirable. The black or dark hued coloring agents employed for the light shielding layer may be enumerated by carbon black, vanadium trioxide, manganese dioxide, molybdenum disulfide, tri-iron tetroxide, aniline black, Sudan Black B and Acid Black. Of these, carbon black is preferred.

In the method of the present invention, a light-irradiated region where a light irradiation amount is different in two steps is formed on the positive photosensitive coating film undeveloped in the step (c) (Hereinafter referred to as "step (d)".). The step (d) may be carried out by light irradiation in the same way as in step (b). The portion where the light shielding layer has been formed is not photosensitive and hence may or may not be irradiated with light. If light irradiation is carried out for forming a colored layer in a portion of a region adjacent to the light shielding layer, it is unnecessary to limit the range of light irradiation to the targeted colored layer with high precision and the light shielding layer may also be irradiated with light so that it is unnecessary to effect registration for pattern formation with high precision.

In the method of the present invention, a larger light-irradiated portion of the positive photosensitive coating film in the light irradiated region formed in the step (d) is developed to lay-open the transparent electrically conductive layer, and subsequently a colored coating layer is electrodeposited thereon to form a colored layer (Hereinafter referred to as "step (e)".). The operation of developing the larger light-irradiated portion in the light irradiated region in the step (e) for laying-open the transparent electrically conductive layer can be performed in the same way as in step (c). On the other hand, the operation of coating the colored coating by electrodeposition for forming the colored layer may be effected using the colored coating under a selected one of electrodeposition conditions as later explained.

The steps (d) and (e) for pre-forming a colored layer of one color after formation of the light shielding layer and before the next steps (f) and (g) of forming a colored layer or layers are indispensable in the method for producing the color filter of the present invention in order that the photosensitive coating film which accounts for a major portion of the material costs be used only once. That is, by pre-forming the light shielding layer and one colored layer by the steps (b) to (e) which may be carried out under moderate light exposure and development conditions, the conditions for light irradiation for pattern formation in the next steps (f) can be rendered less stringent, thereby alleviating damages to the photosensitive coating film by light irradiation and development for enabling the color filter to be produced by using a sole photosensitive coating film. In addition, the method of the present invention can be carried out by employing a sole photosensitive coating film, while enabling the process to be simplified by the next process as compared to the conventional process of forming the colored layers by photolithography by repeating light irradiation and development from color to color.

In the method of the present invention, a light-irradiated region where a light irradiation amount is different in at least three steps is formed on the positive photosensitive coating film undeveloped in the step (e) (Hereinafter referred to as "step (f)".). In addition, in the preferred embodiment of the present invention, a light-irradiated region where the light irradiation amount is different in three steps may be formed on the photosensitive coating film which remains undeveloped in the step (e). There is no limitation to the shape of the light-irradiated region which may be suitably determined depending upon the objective as the color filter.

There is no particular limitation to the method for forming the light-irradiated region where the light irradiation amount is different in at least three steps. That is, light irradiation may be carried out once via a mask having a pattern with at least three steps of light transmittances. Alternatively, light irradiation may be made via a mask having a specific pattern having two steps of light transmittances, and the mask is then displaced and light irradiation is again carried out with a different light irradiation amount followed by repeating the same operation. The former method of carrying out light irradiation once via a mask having a pattern with at least three steps of light transmittances for simplifying the process is preferably employed. A non-irradiated region may be allocated as the region having the least light irradiation amount. In the method of carrying out light irradiation only once via a mask having a pattern with at least three steps of light transmittances, the number of steps of different light transmittances of the mask pattern is at least three and may be selected depending on the number of sorts of the colored coatings employed or the presence or absence of the outer frame. The differences between the light transmittances of the respective steps may be suitably selected depending on the light irradiation conditions or development conditions as later explained. If the number of the above steps is three, the light transmittances of these steps are preferably not more than 0.1%, preferably not more than 0.01%: 5 to 70%, preferably 10 to 60%, more preferably 20 to 40%; and not less than 90%, preferably not less than 99%, respectively.

In the method of effecting light irradiation via a mask having a specific pattern having two steps of light transmittances, then displacing the mask and again effecting light irradiation with a different light irradiation amount, displacement denotes changing the relative position between the mask and the substrate. Thus the substrate may be fixed and the mask is moved, or both the mask and the substrate may be moved. It is desirable that the mask having the specified pattern is such a mask in which pattern blocks (portions transmitted by light) are not overlapped with one another after movement a required number of times. Thus the distance between pattern blocks is such that pattern blocks are not overlapped during each light irradiation after movement of one pattern block has been moved plural number of times.

There is no particular limitation to the direction of mask displacement, which may be in the fore-and-aft direction or left-and-right direction, if in the same plane. The position and relative distance of the pattern blocks of the mask may be suitably determined depending on the number of times of displacement, and the direction or the distance of displacement.

The light irradiation is made with a light irradiation amount different from the amount of previous light irradiation whenever the mask is displaced. There is no particular limitation to means for changing the light irradiation amount and any of the methods of changing the light irradiation time, the distance from the light source or the output of the light source, may be employed. The difference in the light irradiation amounts may be suitably selected depending on the light irradiation conditions or development conditions as later explained. Although there is no particular limitation to the relative difference in the light irradiation amounts, it is usually desirable to provide a significant difference of 5% or higher, preferably 10% or higher.

Instead of displacing the sole mask as described above, two masks having different patterns may be used in alternation for each light irradiation, in which case the light irradiation may be carried out by the same method and in the same irradiation amounts as previously explained.

If at least two masks are employed, the patterns of the masks may be overlapped in part, in which case the light irradiation amounts via the mask may be different. Alternatively, the light irradiation amount may be the same from mask to mask by taking advantage of the fact that the light irradiation amount of overlapped patterns becomes larger than that of the non-overlapped patterns even if the light irradiation amount via the mask remains the same. By employing at least two masks or by moving a sole mask and effecting light irradiation for each displacement, the process may be simplified as compared to the conventional process of repeating light irradiation and development from one color to another, since the light irradiation regions different in at least three steps are collectively formed and development and electrodeposition are subsequently carried out from one color to another. That is, light irradiation may be performed using a sole light irradiating device by simply changing the masks or displacing the mask without the necessity of forming a light-irradiated region via a mask having at least three steps of light transmittances. The master plate may be subjected to development and electrodeposition steps after the end of the entire light irradiation process.

In the method of the present invention, the photosensitive coating film in the light-irradiated region formed in the step (f) is developed to lay-open the transparent electrically conductive layer and subsequently a colored coating is electrodeposited thereon to form a colored layer and the operation of the development and electrodeposition is sequentially repeated at least twice in the order of decreasing light irradiation amounts to thereby form at least a colored layer (Hereinafter referred to as "step (g)".). In a preferred embodiment of the present invention, the operation of developing the photosensitive coating film in the light-irradiated region to lay-open the transparent electrically conductive layer followed by electrodepositing a colored coating to form a colored layer is repeated twice in the order of the decreasing light irradiation amounts to form a colored layer, and subsequently developing the remaining light-irradiated region to lay-open the transparent electrically conductive layer. This method is preferably employed for producing a color filter having an outer frame in which the transparent electrically conductive layer is laid-open in the vicinity of the outer frame.

For light irradiation, UV rays are preferred. A unit capable of generating a large quantity of UV rays, such as a high-pressure mercury lamp, an ultra-high-pressure mercury lamp or a metal halide lamp, may be employed as a light source. If needed, a radiation source other than the source of UV rays may also be used. The light irradiation conditions such as light irradiation amount or time may be suitably selected depending on the positive photosensitive coating, the light exposure units or the masks employed.

In the step (g), a required number of sorts of developing solutions having different dissolving powers with respect to the photosensitive resin are preferably provided for the purpose of sequentially repeating selective development, removal and electrodeposition of the portions of the light-irradiated region having different light irradiation amounts. Selective development may be achieved by adjusting the development time even if the number of sorts of the development solutions is less than the required numbers.

The developing solution which may be employed according to the present invention may usually be an aqueous solution of a basic substance enumerated by sodium carbonate, sodium hydrogen carbonate, sodium metasilicate, tetraalkyl ammonium hydroxide, sodium hydroxide and potassium hydroxide.

For improving wettability or deforming, the developing solution may be admixed with surfactants, organic solvents, such as alcohols, glycol ethers, ketones or chlorinated hydrocarbons, or anti-foaming agents.

The conditions for developing the positive photosensitive coating film may be changed depending on the light irradiation amount for the portion that should be removed, the solubility of the used positive photosensitive coating into the developing solution, the type or the concentration of the developing solution, the developing temperature or the developing time. For example, the concentration of the basic substances, the temperature and the developing time may be usually set to 0.01 to 25 wt %, preferably 0.05 to 20 wt %, 10° to 70° C., preferably 15° to 50° C. and 2 to 600 seconds, preferably 30 to 300 seconds, respectively. If needed, the residual developing solution can be washed with water followed by drying.

Usually, different color hues of the colored coatings to be coated by electrodeposition at the steps (e) and (g) are used from one coating step to another. The color hues overlapped with other regions may be employed according to usage and application.

Although the color hues of the colored coatings may be selected suitably, the three prime colors, namely red, green and blue or cyan, are preferably employed. Although there is no limitation to the color electrodepositing sequence, it is preferred to introduce red color exhibiting utmost UV ray absorption in the first place.

As the colored coating, cationic or anionic resins may be employed as the resin components and dyes and/or pigments may be admixed as colored components. In addition, the coating may be employed which contains acidic or basic substances dissolved and/or dispersed in water. Organic solvents may also be added for facilitating the dissolution and/or dispersion of the resin in the colored coating for improving bath stability and smoothness of the coating film.

The cationic resins employed as resin components of the colored coating may be acrylic resin, epoxy resin, urethane resin, polybutadiene resin or polyamide resin, into which onium groups, such as amino group, ammonium or sulfonium, are introduced, and which are solubilized and/or dispersed in acids or acidic substances, such as formic acid, acetic acid, propionic acid or lactic acid.

The anionic resins employed as resin components of the colored coating may be acrylic resin, polyester resin, maleinated oil resin, polybutadiene resin or epoxy resin, into which carboxylic groups are introduced and which may be solubilized and/or dispersed in water by basic substances, such as triethylamine, diethylamine, dimethyl ethanol amine or ammonia. The film-forming component of the colored coating may exhibit photosensitivity. A mixture of melamine resin with an electrodeposition resin exhibiting strong thermosetting properties, such as acrylic resin or a polyester resin, may be employed as the resin component of the colored coating. Of the resin components, a mixture of the acrylic resin or the polyester resin with the melamine resin is most preferred.

The dyes and/or the pigments employed for the colored coating are selected depending on the targeted color hue. It is however desirable to select those dyes and/or pigments which are free of defects in transparency and durability of the resulting coating film, stability of the coating and electrodeposition characteristics. In such respect, oil-soluble or dispersible dyes are preferred, such as azo dyes, anthraquinone dyes, benzodifuranone dyes and condensed methine dyes. The pigments may be enumerated by organic pigments, such as azo lake, quinacridone, phthalocyanine, isoindolinone, anthraquinone or thioindigo and by inorganic pigments, such as chrome yellow, iron oxide, chrome vermilion, chrome green, ultramarine, prussian blue, cobalt blue, cobalt green, emerald green or titanium white. As for the dyes and/or pigments, reference is had to "COLOR INDEX" whenever the necessity arises.

In the preparation of the colored coating, the resin, dyes and/or pigments, acidic or basic substances and, if needed, a variety of additives, such as organic solvents, dispersion assistant agents for the dyes and/or pigments, levelling agents for improving smoothness of the coating film, viscosity adjustment agents and anti-foaming agents, are mixed together and fully dispersed using well-known dispersion devices, such as sand mills, roll mills or attriters. The resulting dispersion is then diluted in water to a pre-set concentration of the solid content, such as on the order of 2.5 to 25 Wt% and preferably 4 to 20 wt %, to give a coating suited for electrodeposition. The resulting colored coating is electrodeposited on the transparent electrically conductive layer to form a colored layer. There is no particular limitation to the film thickness of the colored layer which may be suitably selected depending on the performance desired of the color filter. The dry film thickness of the colored layer is usually 0.3 to 5 μm and preferably 1 to 3 μm.

There is no particular limitation to the methods for electrodepositing coating according to the present invention, and any of known methods may be employed, such as a method of employing the electrically conductive substrate as an anode or cathode, employing a stainless plate or bar as a counter electrode or an electrically conductive vessel containing the electrodeposition liquid therein as a counter electrode.

Among the electrodeposition coating conditions, which may be suitably selected depending on the kind of the colored coating used, and the film thickness of the desired colored layer, the electrical voltage is usually DC voltage of 5 to 500 V and preferably 10 to 300 V, while the electrodeposition time is usually 5 to 300 seconds and preferably 10 to 200 seconds and the liquid temperature is usually 10° to 35° C. and preferably 15° to 30° C. The supply of the electrical current is terminated when the electrodeposition time necessary to produce a desired film thickness has elapsed. The substrate is then taken out of the bath and, after any excess bath solution is washed off with water or ion-exchanged water, the substrate is dried to form the colored layer.

Although the drying conditions may be suitably selected depending on the conditions of the subsequent steps, it is crucial that sufficient durability to prevent the electrodeposited colored layer from being damaged during at least the subsequent process be afforded to the electrodeposited layer and that such drying be carried out under such conditions as not to impair the characteristics of the positive photosensitive coating film. Thus it is desirable to carry out the drying at a temperature not higher than 150° C. and preferably at 60° to 130° C. and during the drying time usually for 0.01 to 1 hour and preferably for 1 to 30 minutes.

In the method of the present invention, ultrasonic wave is irradiated to the transparent substrate having the transparent electrically conductive layer, i.e. an article to be coated before electrodepositing in at least one of the steps (c), (e) and (g). Most preferably, the steps (c), (e) and (g) are carried out under irradiation of ultrasonic wave, which is preferably carried out in a liquid. As such liquid, the electrodeposition liquid employed in the usual electrodeposition coating process is most preferred. However, a recovered liquid obtained from the coated article from the electrodeposition coating process may also be employed. Alternatively, suitable liquids which may be optionally mixed with colored electrodeposition liquids without adversely affecting the electrodeposition may be used singly or as a mixture with colored electrodeposition liquids.

If irradiation with ultrasonic wave is carried out in the electrodeposition liquid, electrodeposition coating may be carried out directly. If the ultrasonic wave is irradiated in a liquid other than the electrodeposition liquid, such as the recovered liquid, the article to be coated is hoisted from the liquid and immersed in the electrodeposition liquid for electrodeposition.

By such ultrasonic processing, pinholes, whiting etc. may be prohibited and a color filter of high quality free from coloring irregularities may be produced. The ultrasonic wave of a frequency exceeding the audible frequency suffices, with the frequency usually being 16 kHz to 5 GHz and preferably 20 kHz to 1 GHz and more preferably 25 kHz to 100 MHz. If the frequency is outside such range, the above-mentioned desirable effects cannot be produced, or a bulky processing device is required. The conditions of ultrasonic wave irradiation may be suitably selected depending on the size and shape of the vessel in which the article to be coated is immersed, liquid volume and temperature or processing time. The liquid temperature is preferably the same as the electrodeposition temperature in view of process management and may be 10° to 40° C. and preferably 15° to 35° C. If the liquid temperature rises significantly, suitable cooling measures should be used to maintain the above temperature range. The irradiation time is usually 1 to 300 seconds, preferably 5 to 200 seconds and more preferably 10 to 90 seconds. If the irradiation time is less than 1 second, the above-mentioned desirable effect cannot be produced, whereas, if it exceeds 300 seconds, the positive photosensitive coating film, the light shielding layer or the colored layer or layers formed in the previous steps tend to be damaged.

The ultrasonic wave may be generated using a piezoelectric oscillator, an electrostrictive oscillator or a magnetostrictive oscillator. The oscillator may be of a projection type, an extrusion type, an adhesion type or a hone type. The ultrasonic wave may be generated by a direct method of directly immersing the oscillator in a liquid or by an indirect method of charging an article to be coated in a separate vessel and causing ultrasonic wave to operate on the outer vessel.

An ultrasonic output, which may be selected depending on the size of the article, shape and size of the immersion vessel or on whether the direct method or the indirect method is used, is usually 1 to 2 KW, preferably 5 W to 1 kW and more preferably 10 W to 500 W per liter of the liquid. If the output is outside this range, the liquid temperature undesirably tends to be increased significantly due to ultrasonic wave irradiation.

The ultrasonic wave irradiation has a subsidiary effect of easily removing hydrogen or oxygen that is present in a dissolved state in the electrodeposition liquid and generated with electrodeposition.

In the present invention, a liquid and the transparent substrate having the transparent electrically conductive layer are relatively moved and contacted before the electrodepositing in at least one of the steps (c), (e) and (g). Most preferably, the liquid and the substrate are moved and contacted in all of the steps (c), (e) and (g).

As the above liquid, the electrodeposition liquid employed in the usual electrodeposition coating process is most preferred. However, a recovered liquid from the electrodeposition coating process may also be employed. In addition, liquids compatible with the colored electrodeposition liquid and not adversely affecting the electrodeposition may be used alone or as a mixture with the colored electrodeposition liquid.

For relatively moving the article to be coated, that is the transparent substrate having the transparent electrically conductive layer and the liquid, the article is moved and contacted relative to the liquid, the liquid is moved and contacted relative to the article, or both the article and the liquid are relatively moved and contacted with each other.

Examples of the methods for relative movement include (i) a method of repeatedly immersing and hoisting the article with respect to the liquid, (ii) a method of immersing the article in the liquid and moving at least the article in the liquid, (iii) a method of immersing the article in the flowing liquid for desired time, and (iv) a method of flowing down the liquid along the article by spraying or the like. Such movement and contact need to be effected with respect to the surface of the transparent electrically conductive layer of the transparent substrate as the article to be coated. However, such movement and contact may be simultaneously effected with respect to a surface not provided with the transparent electrically conductive layer.

The immersion or hoisting time duration or the number of times of repetition in the method (i) may be suitably selected depending on the shape or size of the article or the temperature or viscosity etc. of the liquid. However, the immersion time or the hoisting time is usually 3 to 180 seconds and preferably 5 to 60 seconds, while the number of times of repetition is usually 1 to 10 and preferably 3 to 6. The operation may be carried out at a temperature close to the temperature of subsequent electrodeposition coating step. If the operating condition is outside the above ranges, pinholes or whiting can hardly be prohibited, while the process is time-consuming, thus resulting in lowered productivity.

In the above method (ii), the movement speed, distance or velocity in the liquid may be suitably set depending on the shape or size of the article or properties of the liquid, such as temperature, viscosity or the like, or movement direction. The movement velocity is usually 50 cm/min to 50 m/min and preferably 5 to 30 m/min, while the movement distance or direction depends on the shape or size of the electrodeposition liquid holding vessel and/or the recovered liquid vessel. The movement may be a reciprocating movement if there is not sufficient room in the vessel relative to the size of the coated article. If the actual condition is outside the above range, pinholes or whiting can hardly be prohibited, while the process becomes time-consuming and productivity tends to be lowered.

In the above method (iii), the liquid flow velocity or the immersion time, which may be suitably set depending on the properties of the liquid, such as temperature or viscosity, is preferably set so that the liquid flow velocity is 1 to 200 cm/sec and preferably 5 to 100 cm/sec and the immersion time is 3 to 180 seconds and preferably 5 to 60 seconds. The article immersing direction, which may be arbitrary relative to the liquid flow direction, is preferably towards the upstream side. The liquid may be ejected during immersion onto the article using a pump or the like.

There is no particular limitation in the method (iv) as to a method of causing the liquid to flow onto the article. It suffices to cause the liquid to flow down the article under atmospheric pressure or elevated pressure directly or using a spray nozzle or the like. The operating conditions, which may be optionally set depending on the properties of the liquid, such as temperature or viscosity, liquid pressure, liquid flow volume or liquid flow time duration or the size and shape of the article, are usually set in the following manner. That is, as to the liquid temperature, during flowing down, for which no particular limitation is set, the lower limit is 10° C. and preferably 15° C. and the upper limit is 40° C. and preferably 35° C. For reasons of process management, the liquid temperature is preferably ±5° C. of the temperature for subsequent electrodeposition coating. Although there is no limitation to the liquid flow time, the lower limit is 1 second, preferably 5 seconds and more preferably 10 seconds. If the flow time is less than one second, the objective of the present invention of preventing occurrence of pinholes or whiting and producing a high-quality color filter free from defects such as color irregularities cannot be fulfilled satisfactorily. Although there is no restriction as to the upper limit of the flow time, the flow time of 300 seconds is sufficient to prevent occurrence of pinholes or whiting and to produce a high-quality color filter free from defects such as color irregularities. A longer flow time is unnecessary for the process. The preferred time is 200 seconds and the more preferred time is 90 seconds. An excessive liquid pressure is not desirable since the liquid is scatterd as fine mist, resulting in polluting the surroundings and destroying the electrodeposited colored films. Thus the liquid pressure not higher than 10 kg/cm$^2$ is usually sufficient. The liquid flow volume, for which no limitation is set, is usually 10 ml/min to 100 liters/min and preferably 50 ml/min to 50 liters/min for a substrate size of 300 mm by 300 mm. The ultrasonic wave may also be irradiated to the liquid for utmost effects. If the operating condition is outside the above-mentioned range, pinholes or whiting can hardly be prohibited, while the process becomes time-consuming to lower the productivity.

After movement and contact of the article to be coated, that is the transparent substrate having the transparent electrically conductive layer, electrodeposition coating is carried out. If the electrodeposition liquid is used for processing, electrodeposition coating may be performed directly. If the recovered liquid is used, the recovered liquid is removed to some extent before immersion in the electrodeposition liquid for electrodeposition. Although the liquid employed for the above processing may be colorless, that is free of dyestuffs and/or pigments, it is desirable to use the electrodeposition liquid which is of the same color hue as that of the electrodeposition liquid employed for the subsequent electrodeposition process.

The color filter as an ultimate product may be fabricated by the above steps (a) to (g). However, the steps of heating, curing or photocuring may be optionally performed for improving weatherability or resistance against chemicals. Such heating and curing may be carried out usually at a temperature of 100° to 270° C. for 6 minutes to one hour and preferably at a temperature of 120° to 250° C. for 15 to 40 minutes. According to the present invention, not only the colored layers and the light shielding layer but also the transparent and electrically conductive portion on the outer frame of the color filter may be fabricated without requiring special process steps.

The method for producing the color filter according to the present invention permits mass production in that fine processing technique is not necessitated and pattern shape of the colored layers may be selected with an ample degree of freedom. In addition, it is possible with the present invention to fabricate the light shielding layer and the colored layers and, if needed, the transparent outer frame, by a simplified method.

EXAMPLES OF THE INVENTION

The present invention will be specifically described with reference to Synthetic Examples and Examples, which are merely illustrative and are not intended for limiting the invention.

SYNTHETIC EXAMPLE 1

Synthesis of Black Coating (BK-1)
Synthesis of Colored Coatings (R-1), (G-1) and (B-1)

An acrylic resin manufactured by TOAGOSEI CHEMICAL INDUSTRY CO. LTD., under the trade name of "ARON S-4030" was neutralized with triethylamine to a pH of approximately 8 and admixed with deionized water to give an aqueous resin solution S.

To the resin solution S were added carbon black, azo metal salt red pigment, Phthalocyanine Green and Phthalocyanine Blue under agitation to produce black, red, green and blue pigment dispersion liquids.

On the other hand, a mixture of the above acrylic resin and a melamine resin manufactured by SUMITOMO CHEMICAL CO. LTD., under the trade name of "M-66B" was neutralized with triethylamine to a pH value of 8 and admixed with deionized water to give an aqueous resin solution T.

The resin solution T was added to each of the pigment dispersion liquids of the respective colors to give a black-hued coating (BK-1) and colored coatings (R-1, G-1 and B-1) having compositions shown in Table 1. The produced black-hued coating (BK-1) and the colored coatings (R-1, G-1 and B-1) were thermosetting and exhibited anionic electrodeposition properties.

TABLE 1

| Coating Number | BK-1 | R-1 | G-1 | B-1 |
| --- | --- | --- | --- | --- |
| Color | Black | Red | Green | Blue |
| Acrylic Resin (Remark 1) | 750.0 | 750.0 | 750.0 | 750.0 |
| Melamine Resin (Remark 2) | 250.0 | 250.0 | 250.0 | 250.0 |
| Triethylamine (Neutralizer) | 61.8 | 61.8 | 61.8 | 61.8 |
| Carbon Black | 333.0 | — | — | — |
| Phthalocyanine Blue | — | — | — | 300.0 |
| Phthalocyanine Green | — | — | 500.0 | — |
| Azometal Salt Red Pigment (Remark 3) | — | 500.0 | — | — |
| Deionized Water | 11935.2 | 13438.2 | 13438.2 | 11638.2 |

Remarks 1: manufactured by TOAGOSEI CHEMICAL INDUSTRY CO., LTD. under the trade name of "ARON-4030"
Remarks 2: manufactured by SUMITOMO CHEMICAL CO. LTD. under the trade name of "M-66B"
Remarks 3: manufactured by SANYO SHIKISO KK under the trade name of "PIGMENT RED 4BS"

Example 1

On a pyrex glass substrate, 0.7 mm in thickness, having an ITO film, 100 m in thickness on its surface, a positive photoresist manufactured by TOKYO OHKA KOGYO KK under the trade name of "OFPR-800" was applied by a spin coater and dried at 80° C. for ten minutes to form a positive photosensitive coating film having a film thickness of 2.5 μm. The resulting assembly is termed a master plate 1.

Using a UV light exposure device having a high-pressure mercury lamp manufactured by ORC MANUFACTURING CO., LTD. under the trade name of "JL-3300", the master plate 1 was irradiated with a UV light at 100 mJ/cm$^2$ via a mask having a pattern with a portion 1 corresponding to a light shielding layer, as shown in FIG. 1. The master plate 1 was then developed with a 2.4 wt % aqueous solution of tetramethyl ammonium hydroxide. The portion of the positive photosensitive coating film corresponding to a light-irradiated region of the mask, that is the portion 1 of the mask having 100% light transmittance, was selectively removed to lay-open the transparent electrically conductive film (ITO film). After washing with water and drying, electrodeposition was carried out at a DC voltage of 28 V at a temperature of 25° C. for 20 seconds, with the master plate 1 as an anode and with a stainless steel beaker containing the black-hued coating (BK-1) as a cathode. After washing the master plate 1 with ion-exchanged water and drying at 120° C. for 10 minutes, a black-hued light shielding layer was formed.

Figure 2:
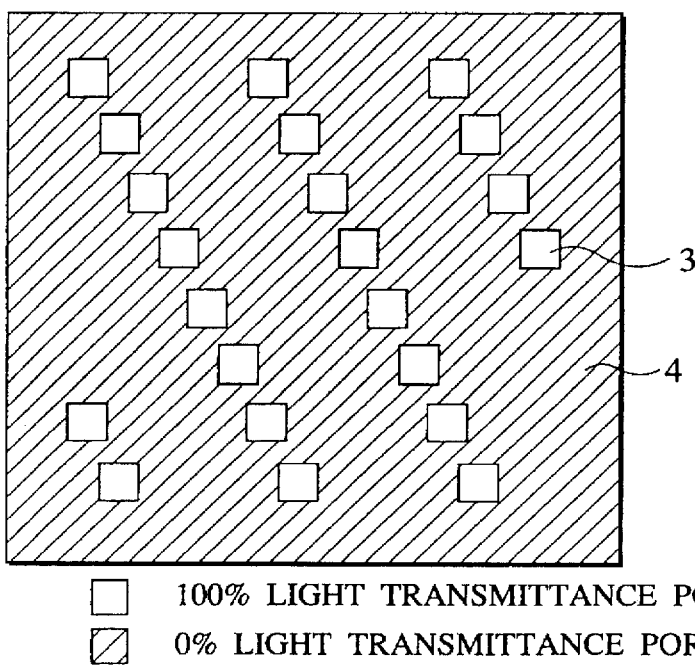
FIG. 2 is a schematic plan view showing another mask having light transmittances different in two steps.

Using a UV light exposure device having a high-pressure mercury lamp manufactured by ORC MANUFACTURING CO., LTD under the trade name of "JL-3300", the master plate 1 was irradiated with a UV light at 100 mJ/cm$^2$ via a mask having a pattern with a portion 3 corresponding to a first colored layer, as shown in FIG. 2. The master plate 1 was then developed with a 2.4 wt % aqueous solution of tetramethyl ammonium hydroxide. The portion of the positive photosensitive coating film corresponding to a light-irradiated region of the mask, that was the portion 3 of the mask having 100% light transmittance, was selectively removed to lay-open the transparent electrically conductive film (ITO film). There was no change noticed in the black-hued light shielding layer. After washing with water and drying, a first red-hued coating (R-1) was electrodeposited in a similar manner to electrodeposition of the black-hued coating (BK-1). The resulting assembly was washed with ion-exchanged water and dried at 120° C. for ten minutes. The first colored layer was formed without any change in the previously formed black-hued light shielding layer.

Figure 3:
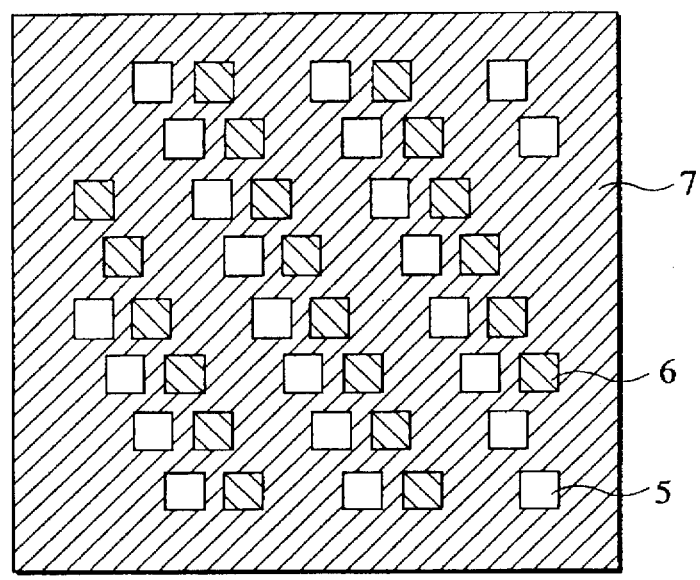
FIG. 3 is a schematic plan view showing a mask having light transmittances different in three steps.

Using a UV light exposure device having a high-pressure mercury lamp manufactured by ORC MANUFACTURING CO., LTD under the trade name of "JL-3300", the master plate 1 was irradiated with a UV light at 100 mJ/cm$^2$ via a mask shown in FIG. 3. The master plate 1 was then developed with a 2.4 wt % aqueous solution of tetramethyl ammonium hydroxide. The portion of the positive photosensitive coating film corresponding to a maximum light-irradiated amount, that is the portion 5 of the mask having the maximum light transmittance, was selectively removed to lay-open the transparent electrically conductive film (ITO film). After washing with water and drying, electrodeposition was carried out at a DC voltage of 28 V at a temperature of 25° C. for 20 seconds, with the master plate 1 as an anode and with a stainless steel beaker containing the second colored (green) coating (G-1) as a cathode. After washing the master plate 1 with ion-exchanged water and drying at 120° C. for 10 minutes, the second colored (green) layer was formed.

The master plate 1 was then developed with a wt % aqueous solution of tetramethyl ammonium hydroxide. The portion of the positive photosensitive coating film corresponding to a portion 6 of the mask having the second largest light-irradiation amount, was selectively removed to lay-open the transparent electrically conductive layer (ITO film). After washing with water and drying, the third colored (blue) coating (B-1) was electrodeposited in a similar manner to electrodeposition of the colored coating (G-1) and the resulting assembly was washed with ion-exchanged water and dried at 120° C. for 10 minutes. The third colored layer was formed with no change noticed in the black-hued light shielding layer or in the first and second colored layers.

The entire surface of the master plate 1 was irradiated with UV rays of 200 mJ/cm$^2$ and any remaining positive photosensitive coating film was removed with a 3.5 wt % aqueous solution of tetramethyl ammonium hydroxide. After washing with water and drying, the transparent electrically conductive layer of the outer frame of the color filter was laid-open. After heating at 180° C. for 30 minutes for curing the light shielding layer and the colored layers, a color filter with a film thickness of 2 μm±0.1 μm which was not tacky at room temperature and which had the black-hued light shielding layer, the colored layers and the transparent outer frame was obtained.

Example 2

In Example 1, after the transparent electrically conductive layer of the outer frame of the color filter was laid-open, the transparent coating (the aqueous resin solution T) was electrodeposited in a similar manner to the colored coating. The resulting assembly was washed with ion-exchanged water and dried at 120° C. for ten minutes. The transparent outer frame was formed without any change noticed in the previously formed black-hued light shielding layer or in the first to third colored layers. After heating at 180° C. for 30 minutes for curing the light shielding layer and the color layers, a color filter with a uniform film thickness of 2 μm±0.1 μm which was not tacky at room temperature and which had the black-hued light shielding layer, the colored layers and the transparent outer frame was obtained.

Example 3

On a pyrex glass substrate, 0.7 mm in thickness, having an ITO film, 100 nm in thickens on its surface, a positive photoresist manufactured by TOKYO OHKA KOGYO KK under the trade name of "OFPR-800" was applied by a spin coater and dried at 80° C. for ten minutes to form a positive photosensitive coating film having a film thickness of 2.5 μm. The resulting assembly is termed a master plate 2.

Using a UV light exposure device having a high-pressure mercury lamp manufactured by ORC MANUFACTURING CO., LTD. under the trade name of "JL-3300", the master plate 2 was irradiated with a UV light at 100 mJ/cm² via a mask having a pattern with a portion 1 corresponding to a light shielding layer, as shown in FIG. 1. The master plate 2 was then developed with a 2.4 wt % aqueous solution of tetramethyl ammonium hydroxide. The portion of the positive photosensitive coating film corresponding to a light-irradiated region of the mask, that is the portion 1 of the mask having 100% light transmittance, was selectively removed to lay-open the transparent electrically conductive film (ITO film). After washing with water and drying, electrodeposition was carried out at a DC voltage of 28 V at a temperature of 25° C. for 20 seconds, with the master plate 2 as an anode and with a stainless steel beaker containing the black-hued coating (BK-1) as a cathode. After washing the master plate 2 with ion-exchanged water and drying at 120° C. for 10 minutes, a black-hued light shielding layer was formed.

Using a UV light exposure device having a high-pressure mercury lamp manufactured by ORC MANUFACTURING CO., LTD. under the trade name of "JL-3300", the master plate 2 was irradiated with a UV light at 100 mJ/cm² via a mask having a pattern with a portion 3 corresponding to a first colored layer, as shown in FIG. 2. The master plate 2 was then developed with a 2.4 wt % aqueous solution of tetramethyl ammonium hydroxide. The portion of the positive photosensitive coating film corresponding to a light-irradiated region of the mask, that was the portion 3 of the mask having 100% light transmittance, was selectively removed to lay-open the transparent electrically conductive film (ITO film). There was no change noticed in the black-hued light shielding layer. After washing with water and drying, a first red-hued coating (R-1) was electrodeposited in a similar manner to electrodeposition of the black-hued coating (BK-1). The resulting assembly was washed with ion-exchanged water and dried at 120° C. for ten minutes. The first colored layer was formed without any change in the previously formed black-hued light shielding layer.

Figure 4:
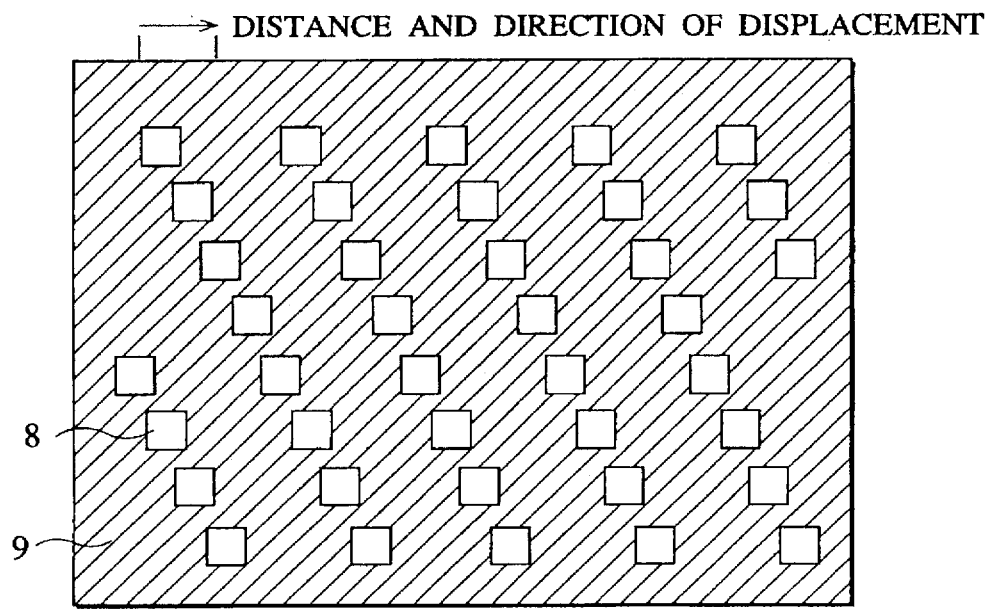
FIG. 4 is a schematic plan view showing a mask for displacement having light transmittances different in two steps.

Using a UV light exposure device having a high-pressure mercury lamp manufactured by ORC MANUFACTURING CO., LTD. under the trade name of "JL-3300", the master plate 2 was irradiated with a UV light at 100 mJ/cm² via a mask having a sufficient length along the displacement directions as shown in FIG. 4. This light irradiation is termed a "first light irradiation". The master plate 2 was then displaced a distance and in a direction indicated in FIG. 4 and irradiated with UV light at 75 mJ/cm². This light irradiation is termed a "second light irradiation".

The resulting assembly was developed with a 2.4 wt % aqueous solution of tetramethyl ammonium hydroxide. The portion of the positive photosensitive coating film having the maximum light irradiation amount, that was irradiated by the first light irradiation, was selectively removed to lay-open the transparent electrically conductive layer (ITO film). After washing with water and drying, electrodeposition was carried out at a DC voltage of 28 V at a temperature of 25° C. for 20 seconds, with the master plate 2 as an anode and with a stainless steel beaker containing the second colored (green) coating (G-1) as a cathode. After washing the master plate 2 with ion-exchanged water and drying at 120° C. for 10 minutes, the second colored (green) layer was formed. The master plate 2 was then developed with a 3.5 wt % aqueous solution of tetramethyl ammonium hydroxide. The portion of the positive photosensitive coating film corresponding to the portion of the mask having the second largest light irradiation amount, which was irradiated by the second light irradiation was selectively removed to lay-open the transparent electrically conductive layer (ITO film). After washing with water and drying, the third colored (blue) coating (B-1) was electrodeposited in a similar manner to electrodeposition of the colored coating (G-1) and the resulting assembly was washed with ion-exchanged water and dried at 120° C. for 10 minutes. The third colored layer was formed with no change noticed in the black-hued light shielding layer or in the first and second colored layers.

Any remaining positive photosensitive coating film was removed with a 2 wt % aqueous solution of sodium hydroxide followed by washing with water and drying. At this time, the transparent electrically conductive layer of the outer frame of the color filter was laid-open. After heating at 180° C. for 30 minutes for curing the light shielding layer and the colored layers, a color filter with a uniform film thickness of 2 μm±0.1 μm which was not tacky at room temperature and which had the black-hued light shielding layer, the colored layers and the transparent outer frame was obtained.

Example 4

On a pyrex glass substrate, 0.7 mm in thickness, having an ITO film, 100 nm in thickness on its surface, a positive photoresist manufactured by TOKYO OHKA KOGYO KK under the trade name of "OFPR-800" was applied by a spin coater and dried at 80° C. for ten minutes to form a positive photosensitive coating film having a film thickness of 2.5 μm. The resulting assembly is termed a master plate 3.

Using a UV light exposure device having a high-pressure mercury lamp manufactured by ORC MANUFACTURING CO., LTD. under the trade name of "JL-3300", the master plate 3 was irradiated with a UV light at 100 mJ/cm$^2$ via a mask having a pattern with a portion 1 corresponding to a light shielding layer, as shown in FIG. 1. The master plate 3 was then developed with a 2.4 wt % aqueous solution of tetramethyl ammonium hydroxide. The portion of the positive photosensitive coating film corresponding to a light-irradiated region of the mask, that was a portion 1 of the mask having 100% light transmittance, was selectively removed to lay-open the transparent electrically conductive film (ITO film). After washing with water and drying, electrodeposition was carried out for 20 seconds at a DC voltage of 28 V at a temperature of 25° C., with the master plate 3 as an anode and with a stainless steel beaker containing a black-hued coating (BK-1) as a cathode. After washing the master plate 3 with ion-exchanged water and drying at 120° C. for 10 minutes, a black-hued light shielding layer was formed.

Using a UV light exposure device having a high-pressure mercury lamp manufactured by ORC MANUFACTURING CO., LTD. under the trade name of "JL-3300", the master plate 3 was irradiated with a UV light at 100 mJ/cm$^2$ via a mask, as shown in FIG. 2. The master plate 3 was then developed with a 2.4 wt % aqueous solution of tetramethyl ammonium hydroxide. The portion of the positive photosensitive coating film corresponding to a light-irradiated region of the mask, that was a portion 3 of the mask having 100% light transmittance, was selectively removed to lay-open the transparent electrically conductive film (ITO film). After washing with water and drying, electrodeposition was carried out for 20 seconds at a DC voltage of 28 V at a temperature of 25° C., with the master plate 3 as an anode and with a stainless steel beaker containing the transparent coating (the aqueous resin solution T) as a cathode. After washing the master plate 3 with ion-exchanged water and drying at 120° C. for 10 minutes, a transparent outer frame was formed.

Figure 5:
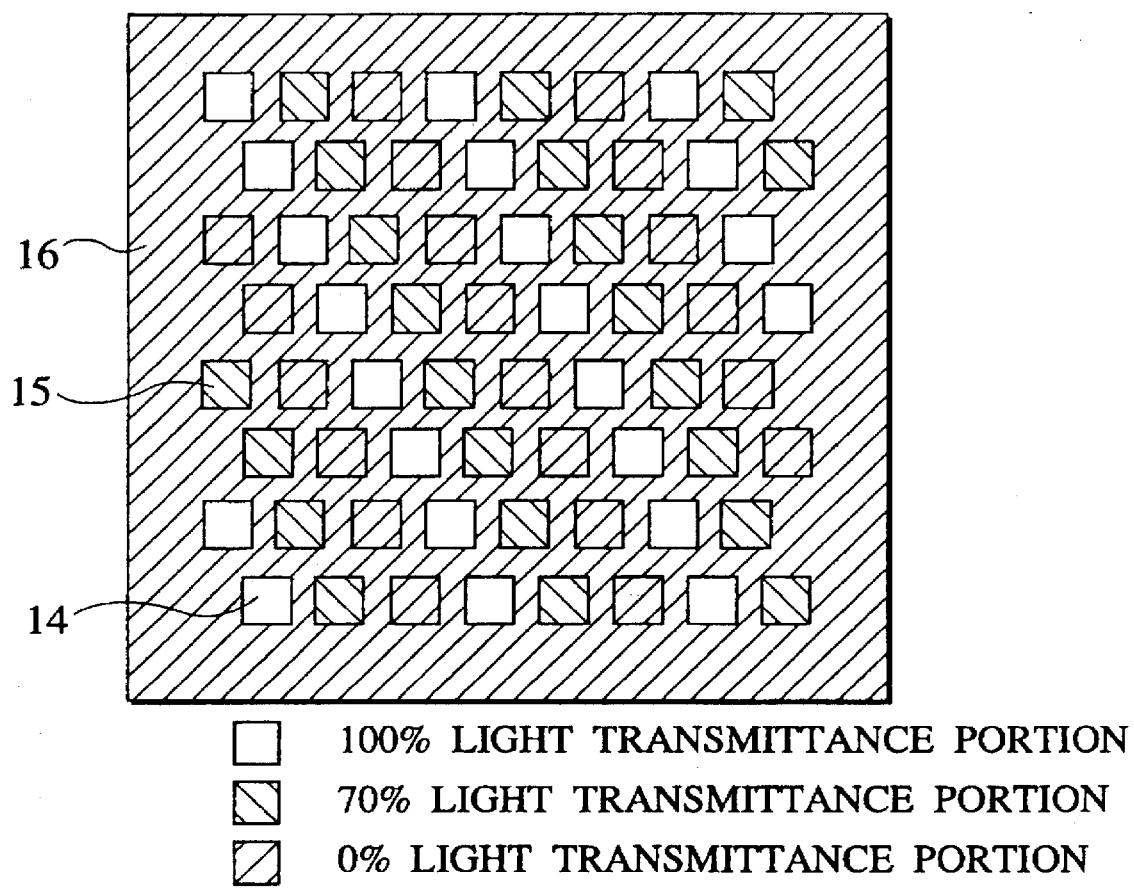
FIG. 5 is a schematic plan view showing still another mask having light transmittances different in three steps.

Using a UV light exposure device having a high-pressure mercury lamp manufactured by ORC MANUFACTURING CO., LTD. under the trade name of "JL-3300", the master plate 3 was irradiated with a UV light at 100 mJ/cm$^2$ via a mask shown in FIG. 5. The master plate 3 was then developed with a 2.4 wt % aqueous solution of tetramethyl ammonium hydroxide. The portion of the positive photosensitive coating film corresponding to a region having the maximum light irradiation amount, that was a region corresponding to a portion 14 of the mask having maximum light transmittance, was selectively removed to lay-open the transparent electrically conductive film (ITO film). After washing with water and drying, the first red-hued coating (R-1) was electrodeposited in a similar manner to electrodeposition of the black-hued coating (BK-1). The resulting assembly was washed with ion-exchanged water and dried at 120° C. for ten minutes. The first colored layer was formed without any change in the previously formed black-hued light shielding layer or in the previously formed outer frame.

The master plate 3 was then developed with a 3.5 wt % aqueous solution of tetramethyl ammonium hydroxide. The portion of the positive photosensitive coating film having the second largest light irradiation amount, that was the region corresponding to a portion 15 of the mask having the second largest light irradiation amount, was selectively removed to lay-open the transparent electrically conductive layer (ITO film). After washing with water and drying, electrodeposition was carried out for 20 seconds at a DC voltage of 28 V at a temperature of 25° C., with the master plate 3 as an anode and with a stainless steel beaker containing the colored coating (G-1) of the second color (green) as a cathode. After washing the master plate 3 with ion-exchanged water and drying at 120° C. for 10 minutes, a colored layer of the second color (green) was formed.

The entire surface of the master plate 3 was irradiated with UV rays of 200 mJ/cm$^2$ and any remaining positive photosensitive coating film was removed with 3.5 wt % aqueous solution of tetramethyl ammonium hydroxide. At this time, the portion of the transparent electrically conductive layer other than the black-hues light shielding layer, the outer frame, and the first and second colored layers, that was the portion corresponding to the third colored layer, was laid-open. After washing with water and drying, the colored coating (B-1) of the third (blue) color was electrodeposited in the same way as electrodeposition of the colored coating (R-1), washed with ion-exchanged water and dried at 120° C. for 10 minutes. The third colored layer was formed without any change noticed in the formed black-hued light shielding layer, the outer frame, and the first and second colored layers. The resulting product was heated at 180° C. for 30 minutes for curing the light shielding layer, the outer frame and the colored layers. A color filter with a film thickness of 2 µm±0.1 µm, which was homogeneous, not tacky at ambient temperature and excellent in transparency and which had the black-hued light shielding layer, the colored layers and the transparent outer frame, was produced.

Comparative Example 1

A positive photoresist was coated on a pyrex glass substrate in the same way as in Example 1 to form a positive photosensitive coating film with a film thickness of 2.5 µm (master plate 1).

Using a UV light exposure device similar to that used in Example 1, the master plate 1 was irradiated via a mask shown in FIG. 2 (a mask having a pattern in registration with a portion 3 corresponding to the first colored layer) with UV rays of 100 mJ/cm$^2$, and developed with a 2.4 wt % aqueous solution of tetramethyl ammonium hydroxide. The portion of the positive photosensitive coating film corresponding to a maximum light-irradiated amount, that was the portion 3 of the mask having 100% light transmittance, was selectively removed to lay-open the transparent electrically conductive film (ITO film). After washing with water and drying, electrodeposition was carried out for 20 seconds at a DC voltage of 28 V at a temperature of 25° C., with the master plate 1 as an anode and with a stainless steel beaker containing the red-hued coating (R-1) as a cathode. After washing the master plate 1 with ion-exchanged water and drying at 120° C. for 10 minutes, the red-hued layer was formed.

After irradiation with UV rays of 100 mJ/cm$^2$ via the mask shown in FIG. 3, the master plate 1 was developed with a 2.4 wt % aqueous solution of tetramethyl ammonium hydroxide. The positive photosensitive coating film was selectively removed in a region having the maximum light irradiation amount corresponding to the highest light transmittance region 5 of the mask, and the transparent electrically conductive layer (ITO film) was laid-open. After washing with water and drying, electrodeposition was carried out for 20 seconds at a DC voltage of 28 V at a temperature of 25° C., with the master plate 1 as an anode and with a stainless steel beaker containing the second green-hued coating (G-1) as a cathode. After washing the master plate 1 with ion-exchanged water and drying at 120° C. for 10 minutes, the second green-hued layer was formed.

The master plate 1 was then developed with a 3.5 wt % aqueous solution of tetramethyl ammonium hydroxide. The portion of the positive photosensitive coating film corresponding to a portion 6 of the mask having the second largest light irradiation amount, was selectively removed to lay-open the transparent electrically conductive layer (ITO film). After washing with water and drying, the third colored (blue) coating (B-1) was electrodeposited in a similar manner to electrodeposition of the colored coating (G-1) and the resulting assembly was washed with ion-exchanged water and dried at 120° C. for 10 minutes. The third colored layer was formed with no change noticed in the previously formed first and second colored layers.

The master plate 1 was then irradiated with UV rays of 100 mJ/cm² via a mask shown in FIG. 1 (a mask having a pattern of a portion 1 corresponding to the light shielding layer) and subsequently developed with a 2.4 wt % aqueous solution of tetramethyl ammonium hydroxide for removing the positive photosensitive coating in the portion corresponding to the mask portion 1 having 100% light transmittance to lay-open the transparent electrically conductive layer (ITO film). After washing with water and drying, electrodeposition was carried out for 20 seconds at a voltage of 28 V at a temperature of 25° C., with the master plate 1 as an anode and a stainless steel beaker containing the black-hued coating (BK-1) as a cathode. After washing the master plate 1 with ion-exchanged water and drying at 120° C. for 10 minutes, the black-hued light shielding layer was formed.

The entire surface of the master plate 1 was irradiated with UV rays of 200 mJ/cm² and any remaining positive photosensitive coating film was removed with a 3.5 wt % aqueous solution of tetramethyl ammonium hydroxide. After washing with water and drying, the transparent electrically conductive layer of the outer frame of the color filter was laid-open. After heating at 180° C. for 30 minutes for curing the light shielding layer and the colored layers. The resulting color filter is poor in refinement or acuteness of the light shielding layer in contact with the colored layers, while the coating or photoresist remains deposited on the outer frame which should be transparent. Thus it may be seen that the color filter becomes defective if the formation of the light shielding layer at the step (c) is carried out after formation of the colored layers.

Comparative Example 2

A positive photoresist was coated on a pyrex glass substrate in the same way as in Example 1 to form a positive photosensitive coating film with a film thickness of 2.5 µm (master plate 1).

Using a UV light exposure device similar to that used in Example 1, the master plate 1 was irradiated via a mask shown in FIG. 1 (a mask having a pattern in registration with a portion 1 corresponding to the light shielding layer) with UV rays of 100 mJ/cm², and developed with a 2.4 wt % aqueous solution of tetramethyl ammonium hydroxide. The portion of the positive photosensitive coating film corresponding to a 100% light-irradiated amount, that was the portion 1 of the mask having 100% light transmittance, was selectively removed to lay-open the transparent electrically conductive film (ITO film). After washing with water and drying, electrodeposition was carried out for 20 seconds at a DC voltage of 28 V at a temperature of 25° C., with the master plate 1 as an anode and with a stainless steel beaker containing the black-hued coating (BK-1) as a cathode. After washing the master plate 1 with ion-exchanged water and drying at 120° C. for 10 minutes, the black-hued light shielding layer was formed.

After irradiation with UV rays of 100 mJ/cm² via the mask shown in FIG. 3, the master plate 1 was developed with a 2.4 wt % aqueous solution of tetramethyl ammonium hydroxide. The positive photosensitive coating film was selectively removed in a region having the maximum light irradiation amount corresponding to the highest light transmittance portion 5 of the mask, and the transparent electrically conductive layer (ITO film) was laid-open. After washing with water and drying, electrodeposition was carried out for 20 seconds at a DC voltage of 28 V at a temperature of 25° C., with the master plate 1 as an anode and a stainless steel beaker containing the first red-hued coating (R-1) as a cathode. After washing the master plate 1 with ion-exchanged water and drying at 120° C. for 10 minutes, the first red-hued layer was formed.

The master plate 1 was then developed with a 3.5 wt % aqueous solution of tetramethyl ammonium hydroxide. The portion of the positive photosensitive coating film corresponding to a portion 6 of the mask having the second largest light irradiation amount, was selectively removed to lay-open the transparent electrically conductive layer (ITO film). After washing with water and drying, the second colored (green) coating (G-1) was electrodeposited and the resulting assembly was washed with ion-exchanged water and dried at 120° C. for 10 minutes.

The master plate 1 was then irradiated with UV rays of 100 mJ/cm² via a mask shown in FIG. 2 (a mask having a pattern corresponding to a portion 3 of the third colored layer) and subsequently developed with a 2.4 wt % aqueous solution of tetramethyl ammonium hydroxide for removing the positive photosensitive coating in a portion corresponding to the portion 3 of the mask having 100% light transmittance to lay-open the transparent electrically conductive layer (ITO film). After washing with water and drying, electrodeposition was carried out for 20 seconds at a DC voltage of 28 V at a temperature of 25° C., with the master plate 1 as an anode and with a stainless steel beaker containing the blue-hued coating (B-1) as a cathode. After washing the master plate 1 with ion-exchanged water and drying at 120° C. for 10 minutes, the blue-hued layer was formed.

The entire surface of the master plate 1 was irradiated with UV rays of 200 mJ/cm² and any remaining positive photosensitive coating film was removed with 3.5 wt % aqueous solution of tetramethyl ammonium hydroxide. After washing with water and drying, the transparent electrically conductive layer of the outer frame of the color filter was laid-open. After heating at 180° C. for 30 minutes for curing the light shielding layer and the colored layers. The color filter thus produced had pinholes in blue-hued pixels and could not be used for a liquid crystal display device. Thus it is seen that, if the steps (d) and (e) are carried out after the steps (f) and (g), the resulting color filter is defective.

Example 5

On a pyrex glass substrate, 0.7 mm in thickness, having an ITO film, 100 nm in thickness on its surface, a positive photoresist manufactured by TOKYO OHKA KOGYO KK under the trade name of "OFPR-800" was applied by a spin coater and dried at 80° C. for ten minutes to form a positive photosensitive coating film having a film thickness of 2.5 µm. The resulting assembly is termed a master plate 4.

Using a UV light exposure device having a high-pressure mercury lamp manufactured by ORC MANUFACTURING CO., LTD. under the trade name of "JL-3300", the master plate 4 was irradiated with a UV light at 100 mJ/cm$^2$ via a mask having a pattern with a portion 1 corresponding to a light shielding layer, as shown in FIG. 1. The master plate 4 was then developed with a 2.4 wt % aqueous solution of tetramethyl ammonium hydroxide. The portion of the positive photosensitive coating film corresponding to a light-irradiated region of the mask, that was the portion 1 of the mask having 100% light transmittance, was selectively removed to lay-open the transparent electrically conductive film (ITO film). After washing with water and drying, a stainless steel beaker containing the master plate 4 immersed in the black-hued coating (BK-1) maintained at 25° C. was charged into an ultrasonic washer manufactured by HONDA DENSHI KK. After irradiating ultrasonic wave of 100 kHz per liter of the black-hued coating (BK-1) at an output of 100 W for 30 seconds, electrodeposition was carried out for 20 seconds at a DC voltage of 28 V at a temperature of 25° C., with the master plate 4 as an anode and with a stainless steel beaker containing the black-hued coating (BK-1) as a cathode. After washing the master plate 4 with ion-exchanged water and drying at 120° C. for 10 minutes, a black-hued light shielding layer was formed.

The master plate 4 was irradiated with a UV light at 100 mJ/cm$^2$ via a mask shown in FIG. 2 (a mask having a pattern with a portion 3 corresponding to the first colored layer). The master plate 4 was then developed with a 2.4 wt % aqueous solution of tetramethyl ammonium hydroxide. The portion of the positive photosensitive coating film corresponding to a maximum light-irradiated amount, that was the portion corresponding to the portion 3 of the mask having the maximum 100% light transmittance, was selectively removed to lay-open the transparent electrically conductive film (ITO film). There was no change noticed in the black-hued light shielding layer. After washing with water and drying, a stainless steel beaker containing the master plate 4 immersed in the colored coating (R-1) maintained at 25° C. was charged into an ultrasonic washer manufactured by HONDA DENSHI KK. After irradiation of an ultrasonic wave in the same way as for the black-hued coating (BK-1), electrodeposition was carried out in the same way as in the black-hued coating (BK-1) to electrodeposit the first colored (red) coating (R-1). After washing the master plate 4 with ion-exchanged water and drying at 120° C. for 10 minutes, the first colored layer was formed without any change in the previously formed light shielding layer.

After irradiation with UV rays of 100 mJ/cm$^2$ via the mask shown in FIG. 3, the master plate 4 was developed with a 2.4 wt % aqueous solution of tetramethyl ammonium hydroxide. The positive photosensitive coating film was selectively removed in a region having the maximum light irradiation amount corresponding to the highest light transmittance region 5 of the mask, and the transparent electrically conductive layer (ITO film) was laid-open. After washing with water and drying, a stainless steel beaker containing the master plate 4 immersed in the colored coating (G-1) maintained at 25° C. was charged into an ultrasonic washer manufactured by HONDA DENSHI KK. After irradiating ultrasonic wave similarly as in the black-hued coating (BK-1), electrodeposition was carried out for 20 seconds at a DC voltage of 28 V at a temperature of 25° C., with the master plate 4 as an anode and with a stainless steel beaker containing the second colored (green) coating (G-1) as a cathode. After washing the master plate 4 with ion-exchanged water and drying at 120° C. for 10 minutes, a second green-hued colored layer was formed.

The master plate 4 was developed with a 3.5 wt % aqueous solution of tetramethyl ammonium hydroxide. The positive photosensitive coating film was selectively removed in the region of the second largest light irradiation amount, that was the portion corresponding to the portion 6 having the second highest light transmittance of the mask for laying-open the transparent electrically conductive layer (ITO film). After washing with water and drying, a stainless steel beaker containing the master plate 4 immersed in the colored coating (B-1) maintained at 25° C. was charged into an ultrasonic washer manufactured by HONDA DENSHI KK. After irradiation with ultrasonic wave similarly as in the black-hued coating (BK-1), the colored coating (B-1) of the third color (blue color) was electrodeposited in the same way as for the black-hued coating (BK-1), washed with ion exchanged water and dried at 120° C. for 10 minutes. A third colored layer was formed without any change noticed in the previously formed black-hued light shielding layer, the first colored layer or in the second colored layer.

The entire surface of the master plate 4 was irradiated with UV rays of 200 mJ/cm$^2$ and freed of any residual positive photosensitive coating film with a 3.5 w % aqueous solution of tetramethyl ammonium hydroxide, washed with water and dried. At this time, the transparent electrically conductive layer of the outer frame of the color filter was laid-open. The results of microscopic observation revealed no defects, such as pinholes in the colored layers. The master plate 4 was heated at 180° C. for 30 minutes for curing the light shielding layer and the colored layers. A color filter with a film thickness of 2 μm±0.1 μm, having the black-hued light shielding layer, the colored layers and the transparent outer frame and showing no tackiness at room temperature, while being free from such defects as pinholes and being superior in uniformity and transparency, was produced.

Examples 6 to 9

Color filters were produced in the same way as in Example 1 except carrying out contact processing shown in Table 2 before each of the electrodeposition steps of Example 1. The results of microscopic observation revealed that the color filters were free from defects such as pinholes or whiting.

TABLE 2

| Ex. | Contact Processing |
|---|---|
| 6 | Electrodeposition liquid used<br>Immersion 20 sec., Hoisting 10 sec. cycle, four times |
| 7 | Electrodeposition liquid used<br>Flow rate 30 cm/sec., Immersion 60 sec. |
| 8 | Recovery liquid used<br>Flow rate 20 liter/min., Time duration 60 sec.,<br>Liquid removal 10 sec. |
| 9 | Electrodeposition liquid used<br>Electrodeposition liquid ejected at a rate of<br>5 liter/min. under a pressure of 1 kg/cm$^2$ at a<br>flow rate of 20 cm/sec. from a point 5 cm to the<br>electrode surface for a processing time of 60 sec. |

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. A method for producing a color filter comprising the steps of:
   (a) forming a positive photosensitive coating film on a transparent electrically conductive layer of a transparent substrate having said transparent electrically conductive layer thereon;
   (b) forming on said positive photosensitive coating film a light-irradiated region where a light irradiation amount is different in two steps using a mask having light transmittances different in two steps;
   (c) developing a light-irradiated portion of the positive photosensitive coating film irradiated with a higher light irradiation amount to lay-upon said transparent electrically conductive layer followed by electrodepositing a light shielding layer thereon;
   (d) forming on the positive photosensitive coating film undeveloped in said step (c) a light-irradiated region where a light irradiation amount is different in two steps using a mask having light transmittances different in two steps;
   (e) developing a light-irradiated portion of the photosensitive coating film irradiated with a higher light irradiation amount in the light-irradiated region formed in said step (d) to lay-open the transparent electrically conductive layer followed by electrodepositing a colored coating thereon to form a colored layer;
   (f) forming on the positive photosensitive coating film undeveloped in said step (e) a light-irradiated region where a light irradiation amount is different in at least three steps using a mask having light transmittances different in two steps or a mask having light transmittances different in three steps; and
   (g) developing the photosensitive coating film in the light-irradiated region formed in said step (f) to lay-open the transparent electrically conductive layer followed by electrodepositing a colored coating thereon to form a colored layer, operation of said developing and electrodepositing in this step being sequentially repeated at least twice in an order of decreasing light irradiation amounts, to thereby form at least a colored layer,
   wherein ultrasonic wave is irradiated to said transparent substrate having said transparent electrically conductive layer before said electrodepositing in at least one of said steps (c), (e) and (g).

2. The method according to claim 1 wherein said ultrasonic wave has a frequency ranging from 16 kHz to 5 GHz.

3. The method according to claim 1 wherein said ultrasonic wave is irradiated for 1 to 300 seconds.

4. The method according to claim 1 wherein said ultrasonic wave is irradiated in a liquid selected from the group consisting of an electrodeposition liquid and a recovery liquid for recovery and re-use of an electrodeposition liquid after electrodeposition.

5. The method according to claim 1 or 4 wherein said light-irradiated region in said step (f) is a light-irradiated region where the light irradiation amount is different in three steps and wherein in said step (g) said operation of developing and electrodepositing in this step is sequentially repeated twice in the order of decreasing light irradiation amounts, to thereby form said colored layers followed by developing the photosensitive coating film in the remaining light-irradiated region to lay-open the transparent electrically conductive layer.

6. The method according to claim 4 wherein said liquid has a temperature of 10° to 40° C.

7. The method according to claim 4 wherein said ultrasonic wave has an output of 1 W to 2 kW per liter of the liquid.

8. A method for producing a color filter comprising the steps of:
   (a) forming a positive photosensitive coating film on a transparent electrically conductive layer of a transparent substrate having said transparent electrically conductive layer thereon;
   (b) forming on said positive photosensitive coating film a light-irradiated region where a light irradiation amount is different in two steps using a mask having light transmittances different in two steps;
   (c) developing a light-irradiated portion of the positive photosensitive coating film irradiated with a higher light irradiation amount to lay-open said transparent electrically conductive layer followed by electrodepositing a light shielding layer thereon;
   (d) forming on the positive photosensitive coating film undeveloped in said step (c) a light-irradiated region where a light irradiation amount is different in two steps using a mask having light transmittances different in two steps;
   (e) developing a light-irradiated portion of the photosensitive coating film irradiated with a higher light irradiation amount in the light-irradiated region formed in said step (d) to lay-open the transparent electrically conductive layer followed by electrodepositing a colored coating thereon to form a colored layer;
   (f) forming on the positive photosensitive coating film undeveloped in said step (e) a light-irradiated region where a light irradiation amount is different in at least three steps using a mask having light transmittances different in two steps or a mask having light transmittances different in three steps; and
   (g) developing the photosensitive coating film in the light-irradiated region formed in said step (f) to lay-open the transparent electrically conductive layer followed by electrodepositing a colored coating thereon to form a colored layer, operation of said developing and electrodepositing in this step being sequentially repeated at least twice in an order of decreasing light irradiation amounts to thereby form at least a colored layer,
   wherein a liquid selected from the group consisting of an electrodeposition liquid and a recovery liquid for recovery and re-use of an electrodeposition liquid after electrodeposition, and said transparent substrate having said transparent electrically conductive layer are relatively moved and contacted before said electrodepositing in at least one of said steps (c), (e) and (g).

9. The method according to claim 8 wherein said transparent substrate having said transparent electrically conductive layer is immersed in said liquid for 3 to 180 seconds and hoisted for 3 to 180 seconds, with operating cycle of immersion and hoisting being carried out once to ten times.

10. The method according to claim 8 wherein said transparent substrate having said transparent electrically conductive layer is moved in said liquid at a rate of 50 cm to 50 m/min.

11. The method according to claim 8 wherein said transparent substrate having said transparent electrically conductive layer is immersed in said liquid moved at a flow rate of 1 to 200 cm/second for 3 to 180 seconds.

12. The method according to claim 8 wherein said liquid having a temperature of 10° to 40° C. is caused to flow down on said transparent substrate having said transparent electrically conductive layer for 1 to 300 seconds under a pressure of not higher than 10 kg/cm$^2$.

13. The method according to claim 12 wherein said liquid is irradiated with an ultrasonic wave.

* * * * *

UNITED STATES PATENT AND TRADEMARK OFFICE
CERTIFICATE OF CORRECTION

PATENT NO. : 5,665,496
DATED : September 9, 1997
INVENTOR(S) : Hiroyoshi OMIKA et al.

It is certified that error appears in the above-identified patent and that said Letters Patent is hereby corrected as shown below:

Title page, [75], Inventors, change "Yokohama" to --Yokohama-shi--; change "Kashiwa" to --Kashiwa-shi--; change "Kawasaki" to --Kawasaki-shi--; and change "Narashino" to --Narashino-shi--.

Signed and Sealed this

Twenty-third Day of December, 1997

Attest:

BRUCE LEHMAN

*Attesting Officer*   *Commissioner of Patents and Trademarks*